United States Patent [19]

Statz et al.

[11] 3,956,025

[45] May 11, 1976

[54] SEMICONDUCTOR DEVICES HAVING SURFACE STATE CONTROL AND METHOD OF MANUFACTURE

[75] Inventors: Hermann Statz, Wayland; Wolfgang M. Feist, Burlington, both of Mass.

[73] Assignee: Raytheon Company, Lexington, Mass.

[22] Filed: Mar. 25, 1974

[21] Appl. No.: 454,647

Related U.S. Application Data

[62] Division of Ser. No. 365,927, June 1, 1973, abandoned.

[52] U.S. Cl. .................... 148/1.5; 357/23; 357/91
[51] Int. Cl.² ........................ H01L 21/265
[58] Field of Search ............ 148/1.5, 187; 357/23, 357/91

[56] References Cited
UNITED STATES PATENTS 3,442,721   5/1969   McCaldin et al. ............. 148/1.5 X
3,852,120   12/1974  Johnson et al. ............... 148/1.5

*Primary Examiner*—L. Dewayne Rutledge
*Assistant Examiner*—J. M. Davis
*Attorney, Agent, or Firm*—John R. Inge; Joseph D. Pannone; Milton D. Bartlett

[57] ABSTRACT

A semiconductor structure having a surface insulating layer formed as a grid with charges implanted in the insulating material to prevent inversion and, hence, channeling between adjacent semiconductor regions, preferably for use in nonblooming vidicon. The method of manufacturing such a structure uses ion implantation to create immobile positive charges in a grid pattern in an insulating layer in regions spaced from the interface between the insulating layer and the semiconductor body. The insulating layer is of sufficient thickness that substantially all of the charge sites in the insulating layer are separated from the outer surface of the insulator by a sufficient distance to effectively prevent a negative electric field from reaching into the silicon.

13 Claims, 6 Drawing Figures

SEMICONDUCTOR DEVICES HAVING SURFACE STATE CONTROL AND METHOD OF MANUFACTURE

CROSS REFERENCE TO RELATED APPLICATION

This is a division of application Ser. No. 365,927 filed June 1, 1973, now abandoned.

BACKGROUND OF THE INVENTION

Many types of semiconductor devices require effective isolation between adjacent regions on the surface of a semiconductor body, such as target structures for vidicons, semiconductor integrated circuits of either the bipolar type or the field effect transistor type, or diode arrays either of the diffused type or the heterojunction type including Schottky barrier devices. Among the methods used to produce such isolation have been diffusion isolation in which regions of opposite or same, but higher, conductivity type are diffused or ion implanted into a semiconductor body and etching in which grooves are formed in the semiconductor body which may, if desired, be filled with insulating material. Also, the charge characteristics between areas on the semiconductor body to be isolated have been controlled by a voltage applied to a metal electrode separated from the semiconductor body by an insulator. Such structures all have disadvantages either in fabrication costs or in the stability of the final product.

SUMMARY OF THE INVENTION

In accordance with this invention, there is disclosed a structure wherein isolation between adjacent areas in the semiconductor body can be achieved in a manner where the product produced will be stable over a wide range of operating conditions. More specifically, this invention discloses that a semiconductor body may have a charge formed in an insulating layer or layers of said body in any desired pattern and by any desired means, such as by ion implanation, and by controlling the accelerating voltage applied to the ions to be implanted, the charge sites in the insulator are concentrated in a region spaced from the interface between the insulating layer and the semiconductor body, with the result that the low surface state characteristics of the layer can be preserved at the interface between the semiconductor body and the insulator while sufficient charge may be implanted in the insulator to create a field extending through the insulator into the semiconductor body of a strength sufficient to prevent lateral surface conductivity upon application by an electron beam of negative charges to the outer surface of the insulator. For example, immobile charges creating field strengths approaching the breakdown potential of the insulator can be readily achieved.

This invention further discloses the discovery that the location of the charges deposited in the insulator will remain substantially unaffected even at elevated temperatures such as up to 900°C. While the mechanism of such implanted charge immobility has not been proven, it is believed to be at least partially the result of radiation damage of the insulator and/or incorporation of foreign atoms. For example, where an insulator such as silicon dioxide or silicon monoxide is subjected to ionic bombardment, permanent high density charge patterns have been produced.

This invention further discloses that relatively low intensity ion bombardment will produce the desired permanent charge when the ions are an alkali metal such as cesium.

This invention further discloses that a particularly useful application of such deposited charge isolation is in a camera pickup tube. For this purpose a silicon wafer several microns thick of N-type material is formed with the N+ layer on one side and a 2000 to 4000 Angstroms thick layer of silicon dioxide on the other side. A silicon dioxide grid pattern containing immobile positive charges is implanted into the surface of the silicon dioxide to a depth of, for example, 1000 Angstroms. The density of the implanted charges is preferably of the order of a few times $10^{12}$ electronic charges per square centimeter. Such a charge density may be produced by ion implantation of boron ions with an ion accelerating potential on the order of 20 kilovolts with a dose of $10^{15}$ ions per square centimeter, or by implanting cesium with an accelerating potential on the order of 120 kilovolts and a dose of a few times $10^{12}$ ions per square centimeter.

The spaces in the grid pattern have an oxide layer, for example 50 Angstroms thick, contacting the semiconductor body. A high resistance layer of, for example, gallium arsenide, 400 Angstroms or so thick is sputter deposited over the entire surface including said thin oxide regions and the ion implanted oxide regions. In accordance with this invention, such a target structure will act as a plurality of discrete heterojunctions formed by the composite of the thin oxide and gallium arsenide layers and the semiconductor body across which a reverse bias charge may be built up by an electron beam scanning the gallium arsenide side of the wafer. The charge can be discharged by electric hole pairs created in the semiconductor body by the impingement of photons of light on the side of the wafer having the N+ layer so that if the electron beam scanning the surface is produced from an electron source maintained at a potential a few volts negative with respect to the potential of the target, electrons from the source after passing through an accelerating beam forming and beam deflection system will charge successive regions scanned by the beam a few volts negative or essentially down to cathode potential, and the surplus electrons will be reflected to be picked up by the anode of the electron gun structure or the decelerating mesh associated with the electron gun. As a result, a light pattern forming a picture impinging on the N+ side of the wafer may be scanned by the electron beam. The output signal may be obtained either from the reflected electrons or from the target structure per se and amplified by conventional means. Due to the fact that a very high positive charge may be created in the insulating layer, induced inversion, by beam deposited electrons, of the silicon regions between adjacent junction areas separated by the grid pattern is prevented and, hence, "blooming" in the presence of strong signals is reduced or eliminated.

In accordance with the preferred process of this invention, a target is formed in which the definition between the elements is performed with relatively low temperature process steps and, hence, the probability, and/or effect, of defects in a target structure having, for example, a million resolution elements, may be substantially reduced. More specifically, a silicon wafer has a layer of oxide grown on both surfaces thereof at elevated temperature. The oxide is stripped from one surface and a layer of gettering material is deposited on the exposed surface of the semiconductor wafer and it is heated in an inert atmosphere to remove any impurities from the wafer. The gettering layer is then removed and the wafer thinned to the desired thickness of the target structure by any desired means, such as etching. An N+ layer 2000 to 4000 Angstroms thick is diffused into the exposed surface of the wafer or, if desired, an N+ layer may be ion implanted into the surface 1000 to 2000 Angstroms thick. In the event ion implantation is used, the wafer should be annealed to reduce the damage to the crystal lattice produced by the ion immplantation. This completes the high temperature processing of the wafer and occurs while no pattern, which could move during high temperature processing, has been produced in the wafer. It should be clearly understood, however, that various patterns could be produced prior to the high temperature processing provided that they were sufficiently nontemperature critical and that the junctions or other interfaces formed would not be damaged or moved sufficiently to render the final device inoperative. The wafer is now subjected to ion bombardment from any desired source, a common one being boron which is compatible with silicon semiconductor material. By adjusting the voltage of the ion implantation, any desired depth profile of concentration of the charges may be achieved and preferably, in accordance with this invention, the thickness of the oxide layer and the voltage between the ion implantation source and the wafer is chosen such that the charge created by an implantation is spaced from the interface between the insulator and the semiconductor by at least several hundred Angstroms. The intensity of ion implantation accelerating field is dependent on the final characteristics of the product but preferably the iimplantation is made sufficiently intense to deposit charges sufficient to produce a field in the insulator approaching the breakdown dielectric strength of the insulating layer. Any overdeposition of such charges causes leak-off of the surplusage through breakdown so that the charge is maintained at or approaching such breakdown potential. Following ion implantation, a grid pattern is formed in the oxide layer by etching through a photoresist to expose regions of the semiconductor body through the apertures in the grid. A thin layer of oxide 50 Angstroms or so thick is grown in the apertures, and a layer of high resistance material such as gallium arsenide is sputter deposited. After 420°C hydrogen annealing, the target structure is installed in the camera tube.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED STRUCTURE

Figure 1:
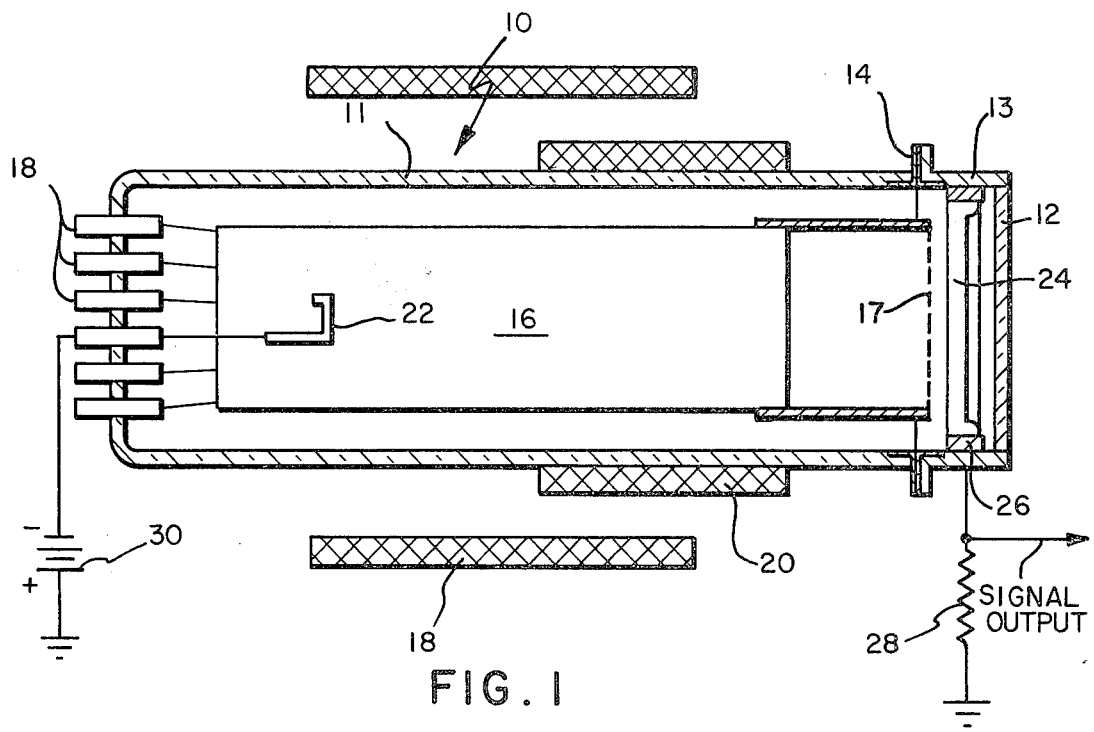
FIG. 1 illustrates a transverse sectional view of a camera tube embodying the invention.
Figure 2:
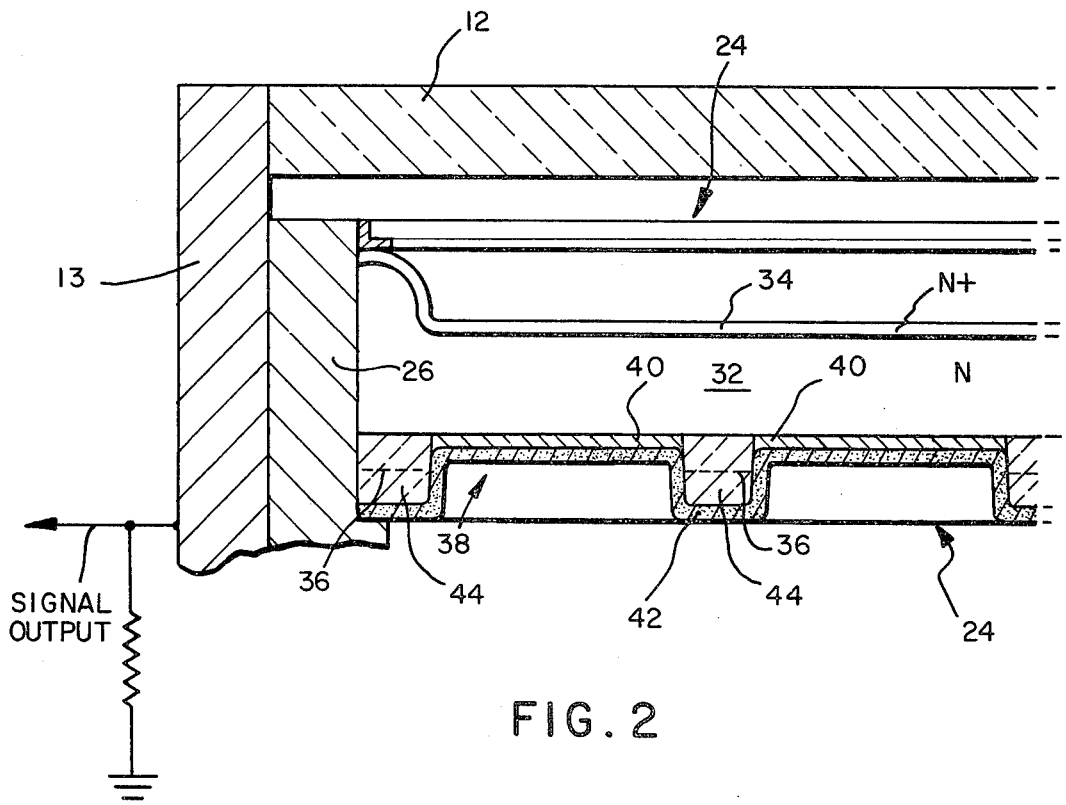
FIG. 2 illustrates an enlarged view of a fragment of the target structure illustrated in FIG. 1.

Referring now to FIGS. 1 and 2, there is shown a camera tube 10 comprising a glass envelope 11 sealed at one end to a glass faceplate 12 and target structure 24 supported in a metal ring 13 welded to a ring 14 sealed to envelope 11. An electron gun, indicated diagrammatically at 16, is supported on a plurality of lead-in pins 18 sealed into the other end of envelope 11. Gun 16 may be of a conventional type used in camera tubes, such as vidicons, having a decelerating mesh electrode 17 attached to the end thereof adjacent target structure 24. Gun 16 may, if desired, provide for electrostatic deflection and focusing of the electron beam produced thereby. Alternatively, the electron beam from gun 16 may be focused by a focus coil 18 and deflected by deflection coils 20 in accordance with wellknown practice.

Electrons from the cathode 22 of gun 16 impinge on a target structure 24 which is supported by metal ring 13 via a conductive ring 26. The signal output from camera tube 10 is taken across a resistor 28 connected between metallic ring 13 and ground. Cathode 22 is maintained negative with respect to ground, for example, 10 volts negative with respect to ground, by a battery 30, and suitable potentials are applied to the other electrodes of the gun 16 to cause the formation of the beam to accelerate the beam to any desired velocity such as, for example, 300 to 1000 electron volts. After passing through decelerating electrode 17, the beam is decelerated to an electron voltage approximately equal to the voltage differential between the target and the cathode produced by the battery 30. The electrons from the beam which strike the target electrode 24 charge the target areas of impingement negative to cathode potential during each successive scan, and those areas of the target which accept no additional charge from the previous scan cause repulsion of the electron beam where it is picked up by the high positive potential at the end of the gun structure 16 facing the target 24. Thus, light passing through faceplate 12 and impinging on target 24 will discharge selected areas of the target 24 in accordance with the intensity of the light beam so that scanning of the target by the electron beam will cause the signal output across resistor 28 to vary as a function of the light picture impinging on target 24. Because the discharging of the areas of target 24 by the light pattern causes differing potentials to exist on the surface of the target 24 facing the electron gun, the target structure must prevent substantial lateral leakage of the stored charge pattern, and such leakage should preferably remain negligible for a wide range of intensities of the light pattern, both in the bulk structure of the target 24 and along the surface thereof.

FIG. 2 shows an expanded view of a portion of target 24 illustrating detailed features of the invention. Target 24 comprises a wafer of silicon 32 whose optimum thickness depends upon the desired picture definition, the light frequencies to be detected and the material. For example, good results can be obtained with wafer 32 made of silicon 10 to 15 microns thick and doped, for example, with phosphorus to produce a carrier intensity in the range of from $3 \times 10^{13}$ to $10^{15}$ carriers per cubic centimeter and a bulk resistance in the range of from 5 to 150 ohm-centimeters. A highly doped N+ surface layer 34, which may be, for example, 0.2 to 0.4 microns thick, is formed on the surface of the wafer 32 closest to the faceplate 12. Layer 34 is preferably sufficiently conductive to provide a good output signal path to the metallic support ring 26 and, hence, via the sealing ring 13 to the output load resistor 28. The surface of wafer 32 opposite layer 34 is coated with an oxide layer 36, which is preferably 0.3 to 0.4 microns thick, and formed as a dense silicon dioxide dry grown on the wafer 32 at elevated temperature. Insulating layer 36 has apertures 38 formed therein, the size and spacing of apertures 38 being dependent upon the desired definition required by the camera tube. For example, if 400 lines per centimeter definition is desired, the spot size of the beam impinging on the target should be less than 1/400 of a centimeter and preferably on the order of 10 microns in diameter. The size of apertures 38 is preferably on the order of 10 microns across, their center-to-center spacing is preferably approximately 12 microns, and the separation of the walls of apertures 38 by the insulating region 36 is approximately 2 microns. While it is to be clearly understood that other sizes and spacings can be used, the foregoing dimensions have been found to provide good results. Positioned in each of the apertures 38 on the silicon body 32 is a surface state suppressing layer 40 formed, for example, as an extremely thin oxide of the wafer material (silicon dioxide) on the order of approximately 50 Angstroms thick. Even though layer 40 is made of $SiO_2$, which usually is insulating, the thinness of layer 40 permits conduction through it, for example, by quantum mechanical transmission.

Positioned over the entire surface of the insulating layers 36 and 40 is a high resistance layer 42 having a thickness of, for example, 0.02 to 0.1 micron, the precise thickness depending upon the characteristics of the material of layer 42. For example, when layer 42 is formed of gallium arsenide, a thickness of approximately 400 Angstroms produces good results. Layer 42 should be sufficiently thick to trap high speed electrons from the beam impinging thereon while not being sufficiently thick to cause substantial conduction of stored charges laterally along the surface of the target structure 24. Electron charges from the beam trapped by gallium arsenide layer 42 and producing charge fields reaching into substrate 32 are discharged by the holes from electron hole pairs produced in body 32 by photons of light impinging on the target 24 through the N+ layer 34, the electrons of the electron hole pairs being conducted to the ring 26 largely through N+ layer 34 and the holes diffusing toward the depletion regions in body 32 adjacent the insulating layers 40 produced by the charges deposited on the layer 42 by the electron beam.

Because bright spots of light on the target 24 can produce substantial cancellation of the depletion zone in the semiconductor body 32 adjacent the interface of insulator 36, some holes of the hole pairs under these conditions tend to be attracted laterally along the interface causing a blooming, and hence loss of definition, in the bright spot areas.

This invention provides means to minimize such loss of definition effects by a built-in field which is provided by charges formed predominantly in those regions 44 of the insulating body 36 which are adjacent the high resistance barrier material layer 42. Such charges are preferably implanted by ion bombardment and may comprise any desired element or combination of elements. Preferably, such charges are implanted by using the same ion implantation materials and techniques used for impurity ion implantation in semiconductor bodies. For example, boron or phosphorus charges may be implanted in insulating layer 36 with a charge density greater than $10^{12}$ charges per square centimeter without substantial creation of deleterious fast surface states at the interface between the insulating layer 36 and the semiconductor body 32. By implanting such charges directly in the insulator and by controlling the velocity of impact of the ions, the position of said ions in the insulating layer 36 can be controlled. Preferably, substantially all of said charges implanted in body 36 are spaced several hundred Angstroms or more from the semiconductor body 32. Such a built-in charge pattern induces a potential well pattern in the semiconductor body 32 comprising regions where holes are repelled thereby retaining the charges in the wells and preventing leakage of holes along charge differential lines between adjacent apertures 38. The extent of the hole leakage barrier produced by the ion implanted charge pattern is dependent, inter alia, on the carrier concentration of the semiconductor body 32, the density of the charges actually trapped in the insulating layer 36, and the shape of such induced charge pattern in the semiconductor body 32 which is, inter alia, dependent upon the distance by which the charge regions 44 are spaced from the semiconductor body 32 by the remainder of the insulating layer 36. In general, it has been found desirable to produce a charge density very substantially greater than that formed by normal ion implantation techniques where ions are implanted into a semiconductor body and the body then oxidized to at least partially trap some of the charges in the resulting insulating layer. Ion implantation by intense ion bombardment directly on the semiconductor body causes substantial amounts of crystal lattice structure damage in the semiconductor, the extent and nature of which cannot be easily controlled, and hence, it has so far been not possible to produce high levels of charge concentration in an oxide by bombarding a semiconductor body and then oxidizing it. In addition, most of the ionizing species is lost by out diffusion during the high temperature oxidation in dry oxygen required to produce the insulating layer. Thus, by bombardment of the insulating material, it has been found that charge concentrations can be built up producing fields up to or exceeding the breakdown potential of the dielectric and that such fields can be used effectively to prevent substantial leakage, such as channeling, in such devices. In addition, due to the large field gradient of several hundred thousand volts per centimeter, ions of elements which might contaminate the semiconductor 40 are, in general, repelled thereby preserving the high barrier characteristics, particularly in the interface between the semiconductor body and the insulating layers.

While most elements used for ion implantation require several orders of magnitude more ions to impinge on the dielectric layer than the charges actually trapped, a particular class of elements, namely, the alkali metals, have been found to be highly efficient for producing a substantially greater percentage of immobile charges in the insulating layer 36 by ion bombardment. More particularly, of the alkali metals, it is preferable to use the larger alkali elements such as cesium, particularly when the target is to be operated at elevated temperatures since charges deriving from the smaller or lighter alkali material elements such as sodium more easily migrate throughout the insulating layer 36.

DESCRIPTION OF THE PREFERRED METHOD OF MANUFACTURE

The structure referred to in FIGS. 1 and 2 is preferably formed in accordance with the following method. A wafer of silicon, for example, 150 microns thick is sliced from an ingot of silicon grown in accordance with well-known practice with a carrier density of, for example, $3 \times 10^{13}$ carriers per cubic centimeter of N-type impurity such as phosphorus. An oxide layer 36 3000 to 4000 Angstroms thick is formed on both sides of the wafer, for example, by heating the wafer to 1000°C in a dry oxidizing atmosphere. The oxide layer is removed from one side of the wafer by etching the wafer in any desired oxide removing etch such as buffered hydrogen fluoride in accordance with well-known practice, and a layer of boron glass 2000 to 3000 Angstroms thick is deposited on the exposed semiconductor surface, for example, by chemical vapor deposition at 950°C, using diborane and oxygen in accordance with well-known practice. The wafer is then annealed in an inert atmosphere such as nitrogen at 950°C for a sufficient time for the boron glass to absorb any impurities present in the semiconductor body, and the glass is then stripped off. The exposed silicon surface is then etched to reduce the thickness of the wafer to a thickness of between 10 and 15 microns.

N+ layer 34 is formed on the exposed silicon surface by exposing said surface to any desired gaseous atmosphere containing N-type impurity such as phosphorus at a temperature of around 900°C for a sufficient time to form an N+ layer 2000 to 4000 Angstroms thick. Alternatively, layer 34 may be formed by ion implantation, for example, with phosphorus with a potential of 50 kilovolts and a dose of $10^{16}$ ions per cubic centimeter, in which case the structure should be annealed to heal to the extent possible lattice defects in the semiconductor material resulting from the ion bombardment.

The opposite side of the wafer from that now containing the N+ layer 34 has the original oxide layer 36 thereon. Cesium ions are implanted in the oxide layer 36 to an average depth of 1000 Angstroms or so using an accelerating field of 120 to 140 kilovolts. Substantially none of the bombarding ions penetrate layer 36 substantially deeper than 2000 Angstroms so that a distance of 1000 Angstroms remains in the insulating layer 36 between the closest of the ion implanted charges and the interface between semiconductor body 32 and insulating layer 36.

Apertures 38 are now etched in the insulating layer 36 by applying a photoresist, photographing a pattern of apertures thereon, dissolving the exposed photoresist in the regions above the apertures and etching the apertures through the photoresist by any desired etch such as buffered hydrogen fluoride. The photoresist is then stripped off. Layers 40 are then grown on the body 32 in the apertures 38 by heating the body 32 to a temperature of 475°C in a wet oxidizing atmosphere for a time, such as thirty minutes, sufficient to grow layers 40 to a thickness of approximately 50 Angstroms. Because layers 40 are very thin and their formation temperature is much below where the ion implanted charges will move substantially, the charges deposited in the regions 44 of the insulating layer 36 remain substantially in place. Thus, it may be seen that in accordance with this invention a method has been discovered where charges may be accurately positioned in an insulating layer and subsequent processing will not cause substantial change of the density and position of such charges.

The oxide layers 40 may, if desired, be sputter deposited or produced by other lower temperature means, but it has been found satisfactory when using relatively high bulk resistance N-type material such as the body 32 to oxidize additional portions of the body 32, such portions extending slightly into the body 32 from the interface of the layer 36 with the body 32.

The electron trapping barrier layer 42 is now deposited by sputtering gallium arsenide from an electrode in an argon atmosphere for a sufficient time to produce layer 42 on the order of 300 to 600 Angstroms thick. Finally, the entire device is annealed in hydrogen at 420°C.

The target 24 is then assembled in the tube 10 in accordance with well-known practice.

PREFERRED MODE OF OPERATION OF THE INVENTION

A light pattern falls onto the N+ side of the thin N-type silicon wafer to produce a pattern of electron hole pairs. The side of the wafer scanned by the electron beam has a layer of gallium arsenide or other suitable material which traps impinging electrons from the beam to charge the layer uniformly negative, producing a gradient across the thin oxide regions in the apertures in the grid structure. The total voltage drop including that produced by the junction effect between the gallium arsenide and the silicon may be, for example, 10 volts, so that if the entire voltage were developed across the 50 Angstroms thick layer of oxide, it would produce a gradient greater than $10^7$ volts per centimeter. Gradients substantially below this will produce sufficient charge transmission through layers 40 for the primary voltage drop to be across the effective junctions between the gallium arsenide layer 42 and the silicon body 32. One purpose, inter alia, of the thin oxide layers 40 is to produce a reduction in the density of surface states at its junctions with body 32 and may be thought of as a buffer layer between the silicon wafer and the gallium arsenide film.

While the precise mechanism involving the thin oxide layers 40, the gallium arsenide layer 42 and the silicon body 32 is not completely understood, it is clear that such a structure acts as a unidirectional conductor, that is, a current will flow from the silicon to the gallium arsenide when the gallium arsenide is maintained positive with respect to the silicon, but when the voltage is reversed, no current will flow if no holes are present in the silicon and a charge is built up across the junction.

When the N+ surface of the wafer is exposed to light, photons create electron hole pairs in the silicon body. Due to the negative charge produced on the gallium arsenide film by the electron beam, a depletion, or space charge, region is built up in the silicon body extending toward the N+ layer. The holes diffuse until reaching said depletion region where they are drawn rapidly to the interface of the semiconductor body 32 and the oxide layer 40 while electrons are repelled and eventually collected by the N+ layer and conducted to the support ring 13 surrounding the wafer. The holes, by quantum mechanical tunneling, or by some mechanism not completely understood, penetrate the thin silicon dioxide layers 40 and enter the gallium arsenide layer 42 where they discharge the electrons trapped therein from the beam by recombining with them. The scanning electron beam then recharges the gallium arsenide film to cathode potential upon its next passage over the region discharged by penetration of the holes. The charging current is sensed by a voltage developed across load 28 which represents the video signal.

The use of such an implanted charge grid structure prevents washing out of the picture details due to excessive sidewise motion of the holes. The holes spend a finite time at the interface between the gallium arsenide film and the silicon crystal before passing into the gallium arsenide, and due to the fact that the positive hole charge varies from point to point in accordance with illumination levels, potential gradients exist along the interface surface. These potential gradients tend to distribute the hole charge uniformly across the surface thereby washing out the picture. Lateral motion of the holes is prevented by forming potential wells in the silicon body which are of the order of 10 volts deep at the interface with the gallium arsenide film because a hole has only a thermal energy equal to KT, where K is a constant and T is temperature, and this thermal energy is about 0.025 electron volts at 300°K resulting in holes being unable to escape laterally from the wells. The holes are then attracted to, and held at, the heterojunction surface by the back bias potential until they pass into the gallium arsenide where they recombine with the beam deposited electrons.

By forming the charge grid in the thick layer of silicon dioxide, that is, by forming an oxide film in accordance with this invention and froming a grid of charges in the oxide, the effect of an N+ grid diffused or implanted into the silicon body may be achieved because the positive charges in the oxide attract excess electrons to the silicon interface. However, in order to accomplish this, the space charge in the implanted oxide grid should preferably be large enough so that it will substantially completely shield the electron charge deposited by the scanning beam on top of the oxide grid 36 from the silicon.

More specifically, for example, a charge buried to an average depth of 500 Angstroms must be able to produce a field equal to that produced by charging the oxide surface to the cathode potential. For example, the number N of positive charges per square centimeter at a depth L to accommodate the cathode to target voltage drop V should be at least equal to said voltage times the dielectric constant of the insulator divided by the average charge depth times the electronic charge. Thus, with V equal to 10 volts, the average relative dielectric constant equal to 3.8 for silicon dioxide and an average charge depth L equal to $5 \times 10^{-6}$ centimeters, the quantity N of implanted charges is approximately equal to $4 \times 10^{12}$ charges per square centimeter.

A charge of $10^{12}$ to $10^{14}$ or so electron charges per square centimeter may be locked into oxide layer 36 by bombarding the surface thereof with ions. It has been found that for most kinds of ions fixed charged production in the insulator, which is not completely understood, occurs only once for every several hundred or so ions injected into layer 36. For example, boron ion implanted an average distance into a silicon dioxide layer of 500 Angstroms or $5 \times 10^{-6}$ centimeters with a voltage of approximately 20 kilovolts between the ion source and the insulator requires a bombardment of more than $10^{15}$ ions per square centimeter to produce a charge density of approximately $4 \times 10^{12}$ charges per square centimeter. Preferably, ions which are substantially completely trapped in the oxide are used, examples of which are alkali metals such as cesium. Ion implantation for cesium requires a voltage of approximately 60 to 140 kilovolts and a total bombardment density approximately equal to, or greater than, $4 \times 10^{12}$ ions per square centimeter to produce a charge density of $4 \times 10^{12}$ electronic charges per square centimeter. Because the cesium ions are relatively large, they remain stationed substantially in situ even when the insulator has been heated to temperatures of several hundred degrees Centigrade. On the other hand, lighter alkali metal ions such as sodium move relatively easily in the insulator and are not desirable for this purpose, particularly at elevated temperatures.

It is contemplated that many types of ions may be implanted in this manner and that lattice defects produced in the oxide will produce the positive charge trapped therein.

Such a process is relatively insensitive to processing defects. If, for example, a portion of the ion implanted oxide grid breaks off, no visible blemish will result other than a possible enlargement of a few basic resolution cells. Similarly, a pinhole in the oxide would not be disturbing since the gallium arsenide layer still forms a heterojunction which will be reverse biased when contacting the silicon body.

ALTERNATIVE EMBODIMENTS OF THE INVENTION

Figure 3:
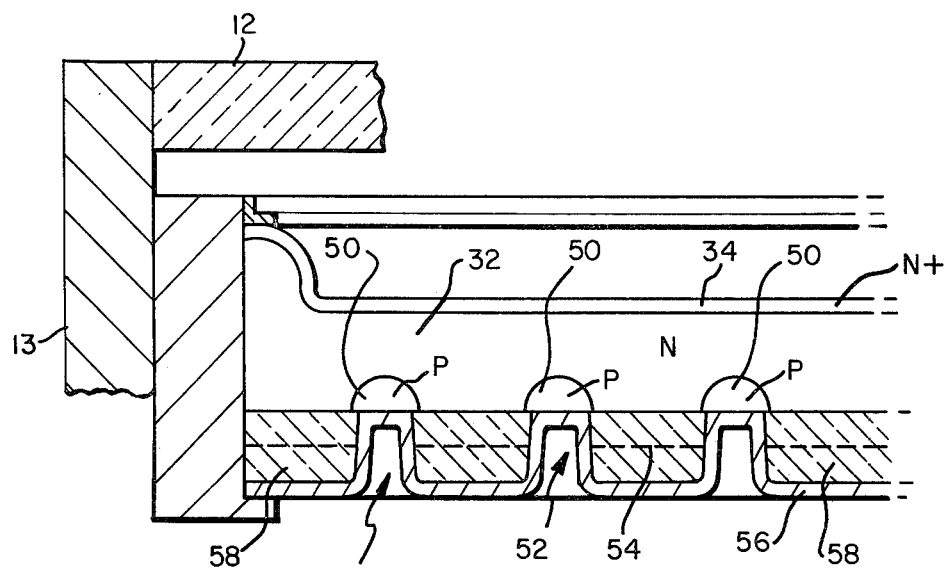
FIG. 3 illustrates an alternative target structure embodiment of the invention.

Referring now to FIG. 3, there is shown an alternative embodiment of a target structure in which a semiconductor body 32 of N material having an N+ layer 34 formed thereon in accordance with the previously described system also has a plurality of P-type junctions 50 formed therein in accordance with wellknown practice by diffusion through apertures 52 in a silicon dioxide layer 54 several thousand Angstroms thick. A layer of high resistance material 56 such as gallium arsenide 200 to 500 Angstroms thick is formed over the insulating layer 54 and contacts the P junction regions 50 through the apertures 52. Such a structure will also bloom when subjected to bright spots of intensity impinging light and, in accordance with this invention, regions 58 formed by ion bombardment in a manner previously discussed are used to prevent shorting out the regions between adjacent P regions 50. Such shorting has been called channeling, and the use of external metal grids with a voltage thereon has been used in attempts to prevent such channeling. However, the formation of a complex overlay grid structure a few microns in width over a large number of individual junctions, for example a million junctions, in a typical camera tube without encountering any shorts between the metal conductor and the junctions or semiconductor body makes such a structure extremely difficult and expensive to fabricate.

Figure 4:
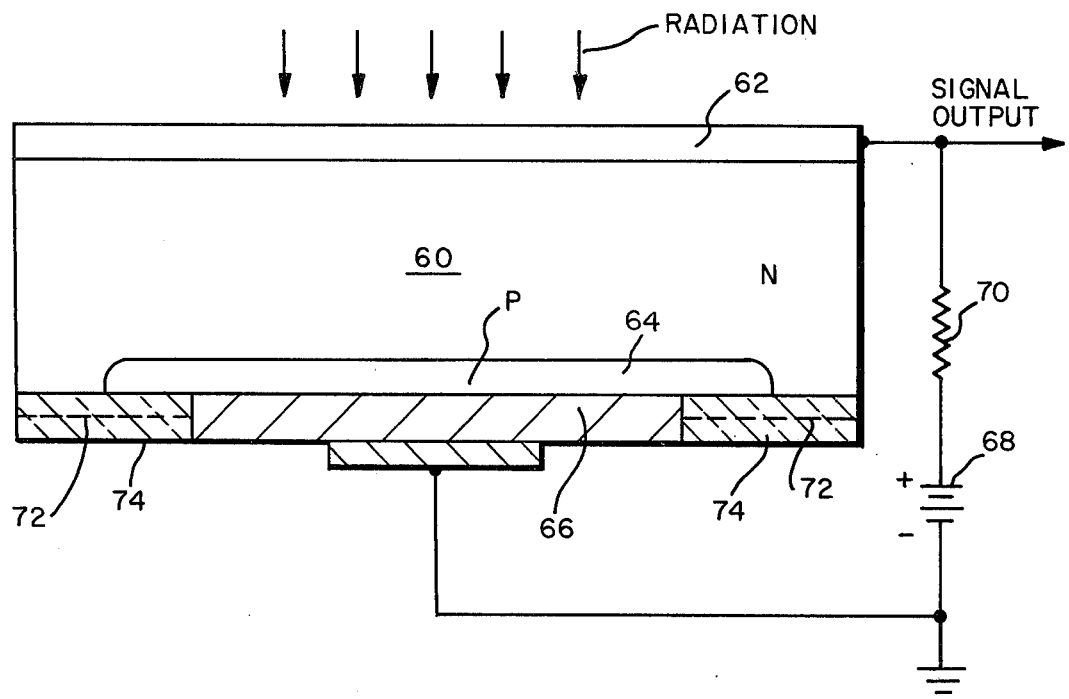
FIG. 4 is a photo diode illustrating another embodiment of the invention.

Referring now to FIG. 4, there is shown the application of this invention to a conventional diode assembly for eliminating dark current. In such a device, a body of semiconductor material 60, preferably of N-type silicon, has an N+ layer 62 formed thereon substantially in accordance with the previously referred to practice, and a junction region 64 of P-type material diffused therein to which a metal contact 66, for example of platinum, is formed on region 64 in accordance with well-known practice. A reverse bias is produced across the junction by means of a battery 68 connected between the contact 66 and the N+ layer 62 through an output signal load resistor 70. An oxide layer 72 is formed over the junction between regions 64 and 60, and an ion implanted charge in the region 74 of silicon dioxide layer 72 is formed approaching the dielectric breakdown strength of the layer 72. This results in a substantial reduction in leakage and, hence, dark current across the junction at its interface with the surface of body 60 thereby increasing the sensitivity and performance of the device.

Figure 5:
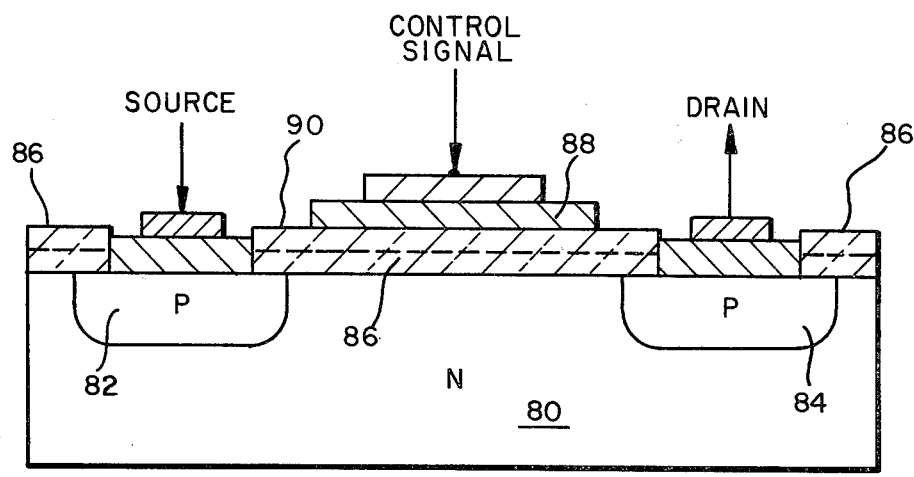
FIGS. 5 and 6 illustrate field effect transistors as alternative embodiments of the invention.

Referring now to FIG. 5, there is shown a field effect transistor comprising a body 80 of N-type semiconductor material having a P-type source region 82 and a P-type drain region 84 formed therein by diffusion through apertures in an oxide layer 86 in accordance with well-known practice. The change in the channel control voltage between regions 82 and 84 which results from variation in the charge in the portion of the insulating layer 86 beneath the control electrode 88 is controlled in accordance with this invention by trapping charges in the region 90 of layer 86 directly beneath the control electrode 88, such charges being deposited to create a field approaching the strength of the dielectric layer 86 effectively preventing the migration of additional charges into this region to shift the on/off points of the field effect device. It should also be pointed out that by this mechanism any desired bias voltage may be applied to the field effect device by controlling the thickness of the layer 86 and the charge produced in the portion 90.

Figure 6:
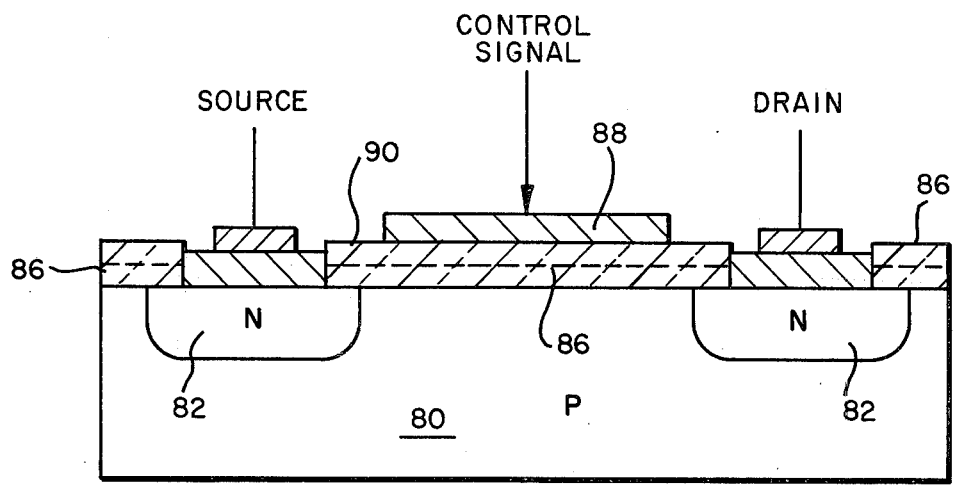

Referring now to FIG. 6, there is shown a semiconductor field effect device similar to that illustrated in FIG. 5 except that the body 80 is of P-type material whereas the source and drain are N-type material. By the use of charges in the region 90 of the insulating layer 86, a bias is produced on the field effect device resulting in a practical N channel field effect transistor. Thus, it may be seen that by the use of such charge deposition directly into the insulator, the underlying semiconductor crystal lattice structure can remain unchanged and, hence, suitable for the accurately reproducible formation of channels in field effect devices while providing a built-in bias for the control electrode 88 of such devices.

This completes the description of the embodiments of the invention illustrated herein. However, many modifications thereof will be apparent to persons skilled in the art without departing from the spirit and scope of this invention. For example, any desired semiconductor material could be used for the body 32, and any desired kind of junction, including true Schottky barrier devices, can be used. Also, a wide range of dopant densities of the semiconductor body and insulating materials or charge implanting ions such as phosphorus can be used. In addition, the invention may be applied to a wide range of devices such as bipolar transistors, integrated circuits, interdigital microwave devices, and image intensifier tubes. Accordingly, it is contemplated that this invention be not limited to the particular embodiments disclosed herein except as defined by the appended claims.

What is claimed is:
1. The process of forming a semiconductor barrier structure comprising:
forming a body of semiconductor material;
forming a plurality of junction regions in or with said body surrounded by insulating regions having charges fixed substantially entirely in first portions of said insulating regions, said first portions of said insulating regions being separated from the interface of said insulating regions with said semiconductor body by second portions of said insulating regions, said second portions of said insulating regions being substantially free of fixed charges.
2. The process in accordance with claim 1 wherein: said step of forming said junction regions comprises forming an insulating layer and forming a plurality of apertures in said layer.
3. The process in accordance with claim 2 wherein: the step of forming said junctions further comprises forming barrier regions in said apertures.
4. The process in accordance with claim 3 wherein: said step of forming said junction regions further comprises forming a layer of charges in said insulating layer which produces a field approaching the dielectric breakdown strength of said insulating layer.
5. The process in accordance with claim 4 wherein: said charges are formed in said layer prior to the formation of said apertures.
6. The process comprising the steps of:
forming a body of semiconductor materials; and
forming junctions in apertures in a layer of insulating material in contact with said semiconductor body and having charges fixed in regions of said insulating layer between said apertures.
7. The process in accordance with claim 6 wherein: said junctions comprise insulating layers formed in said apertures and a high resistance layer contacting said insulating layers.
8. The process in accordance with claim 7 wherein: said step of forming said junctions comprises forming charges in regions of said insulating apertured layer surrounding said junctions and spaced from said semiconductor body with the density of said charges producing electric fields exceeding the major portion of the dielectric breakdown strength of said insulating layer.
9. The process in accordance with claim 8 wherein: said high resistance layer is formed over said apertured insulating layer and said insulating layers in said apertures.
10. The process in accordance with claim 9 wherein: said high resistance layer comprises a compound.
11. The method comprising the steps of:
forming a semiconductor body; and
forming one or more barrier junctions with said body by forming a thin layer of insulating material on said body and forming a layer of high resistance material on said layer of insulating material.
12. The method in accordance with claim 11 wherein:
the step of forming said body comprises forming said body of a predetermined conductivity type and forming a layer of said conductivity type having a higher impurity concentration than the average impurity concentration of said body on a surface of said body.
13. The method in accordance with claim 12 wherein:
said step of forming said junction or junctions comprises forming said junctions on a surface of said body opposite to said surface having said higher impurity layer.

* * * * *